(12) United States Patent
Zuilhof et al.

(10) Patent No.: US 8,993,479 B2
(45) Date of Patent: Mar. 31, 2015

(54) PHOTOCHEMICAL MODIFICATION OF SOLID MATERIALS

(75) Inventors: Johannes Teunis Zuilhof, Bennekom (NL); Jurjen ter Maat, Leiden (NL)

(73) Assignee: Surfix BV, Wageningen (NL)

( * ) Notice: Subject to any disclaimer, the term of this patent is extended or adjusted under 35 U.S.C. 154(b) by 617 days.

(21) Appl. No.: 13/124,653

(22) PCT Filed: Oct. 16, 2009

(86) PCT No.: PCT/NL2009/050624
§ 371 (c)(1), (2), (4) Date: Jun. 30, 2011

(87) PCT Pub. No.: WO2010/044668
PCT Pub. Date: Apr. 22, 2010

(65) Prior Publication Data
US 2011/0251059 A1    Oct. 13, 2011

(30) Foreign Application Priority Data
Oct. 17, 2008   (EP) .................................... 08166959

(51) Int. Cl.
*B32B 17/08* (2006.01)
*B32B 23/20* (2006.01)
(Continued)

(52) U.S. Cl.
CPC ............... *C03C 17/28* (2013.01); *C03C 23/002* (2013.01); *C04B 20/1022* (2013.01);
(Continued)

(58) Field of Classification Search
CPC ............ C03C 23/002; C03C 2218/111; C04B 20/1022; C04B 41/009; C04B 41/46; C04B 41/82; C04B 2111/27; C23C 22/02; G03F 7/027; B05D 3/0493; B05D 3/061; B05D 1/18; C08F 214/18
USPC .......... 423/335, 625, 700, 716; 427/582–584; 502/439
See application file for complete search history.

(56) References Cited

U.S. PATENT DOCUMENTS 4,560,599 A   12/1985 Regen
6,569,979 B1   5/2003 Strother et al.
(Continued)

FOREIGN PATENT DOCUMENTS

EP     1 403 211 A2   3/2004
EP     1 772 479 A1   4/2007
WO    WO-2006/067061 A2   6/2006

OTHER PUBLICATIONS

Buriak, "Organometallic Chemistry on Silicon and Germanium Surfaces," Chemical Reviews, vol. 102, No. 5, (2002) pp. 1271-1308, XP-002522090.
(Continued)

*Primary Examiner* — Anthony J Zimmer
(74) *Attorney, Agent, or Firm* — Gilberto M. Villacorta; Sunit Talapatra; Foley & Lardner LLP

(57) ABSTRACT

The present invention relates to a process for modifying or functionalizing oxide surfaces, such as surfaces of $SiO_2$ and $Al_2O_3$, but also metals including alloys such as stainless steel with alkenes or alkynes under mild conditions by photochemical reaction. The process is very well suited to form patterned modified surfaces which are of use for example in microelectronics, biosensing and catalysis.

30 Claims, 2 Drawing Sheets

(51) Int. Cl.
*C01B 33/12* (2006.01)
*C03C 17/28* (2006.01)
*C03C 23/00* (2006.01)
*C04B 20/10* (2006.01)
*C04B 41/00* (2006.01)
*C04B 41/46* (2006.01)
*C04B 41/82* (2006.01)
*C23C 22/02* (2006.01)
*G03F 7/027* (2006.01)
*B05D 1/18* (2006.01)
*B05D 3/04* (2006.01)
*B05D 3/06* (2006.01)
*C04B 111/27* (2006.01)
*C08F 214/18* (2006.01)

(52) U.S. Cl.
CPC ............ *C04B 41/009* (2013.01); *C04B 41/46* (2013.01); *C04B 41/82* (2013.01); *C23C 22/02* (2013.01); *G03F 7/027* (2013.01); *B05D 1/18* (2013.01); *B05D 3/0493* (2013.01); *B05D 3/061* (2013.01); *C03C 2217/76* (2013.01); *C03C 2218/111* (2013.01); *C04B 2111/27* (2013.01); *C08F 214/18* (2013.01)
USPC .......................................... 502/439; 423/335

(56) References Cited

U.S. PATENT DOCUMENTS

| | | |
|---|---|---|
| 6,841,079 B2 * | 1/2005 | Elsbernd et al. ................ 216/2 |
| 2002/0018854 A1 | 2/2002 | McCarthy et al. |
| 2004/0012061 A1 | 1/2004 | Reid et al. |
| 2005/0255514 A1 | 11/2005 | De Palma et al. |
| 2006/0014013 A1 | 1/2006 | Saavedra et al. |

OTHER PUBLICATIONS

Sun, et al., "Covalently Attached Monolayers on Crystalline Hydrogen-Terminated Silicon: Extremely Mild Attachment by Visible Light," J. Am. Chem. Soc. vol. 127, No. 8, (2005), pp. 2514-2523, XP-0025091.

Search Report mailed Nov. 25, 2009 in International Application No. PCT/NL2009/050624.

Mischiki et al., "Reaction of Alkenes with Hydrogen-Terminated and Photooxidized Silicon Surfaces. A Comparison of Thermal and Photochemical Processes," Langmuir, vol. 22, 2006, pp. 8359-8365.

Raman et al., "Self-Assembled Monolayers of Alkanoic Acids on the Native Oxide Surface of SS316L by Solution Deposition," Langmuir, vol. 23, 2007, pp. 2284-2288.

Ter Maat, et al. "Photochemical Covalent Attachment of Alkene-Derived Monolayers onto Hydroxyl-Terminated Silica", Langmuir, Apr. 30, 2009, vol. 25, No. 19, pp. 11592-11597.

* cited by examiner

PHOTOCHEMICAL MODIFICATION OF SOLID MATERIALS

FIELD OF THE INVENTION

The invention is in the field of modified metal oxide and silicon oxide surfaces and the photochemical process for the preparation thereof.

BACKGROUND OF THE INVENTION

Silicon and aluminum, after oxygen, are the most abundant elements on earth. Their oxides are stable, relatively inert and cheap. Because of this, these oxides have found many applications, for example as support material in catalysis or in chemical analysis. Many of these applications require tailoring of the surface properties.

Silica glasses, for example, are an important class of materials because of their excellent optical properties. The specific properties of a silica glass depend on its composition and fabrication method.[1] Whereas silica glasses made from natural quartz show considerable absorption above 200 nm, synthetic fused silica is transparent at wavelengths down to 180 nm. Optical transparency is a desired property in the field of biosensing, where techniques of fluorescent labeling are well-developed.[2] For biosensing, the material of choice should also be easily functionalizable.

For silica, a number of functionalization methods have been developed, such as for example esterification of silica surface hydroxyl groups with alcohols.[3] However, a disadvantage of this method is that the resulting monolayers are prone to hydrolysis, which may be problematic for certain applications.[4]

The currently prevailing method makes use of organosilanes such as organotrichloro- or organotrialkoxysilane derivatives,[5] which can react with surface hydroxyl groups to yield a closely packed monolayer.[6, 7] For example US 2005/0255514, incorporated by reference herein, discloses a method to functionalize substrates such as silicon, glass, silica, quartz and metal oxides with a silane having an oligoethylene oxide group to provide protein resistance. In general, modification of OH-terminated surfaces with organosilanes is rapid, is usually performed in dilute solutions, and several functional groups are compatible with the procedure. Patterned functionalization of silica surfaces is e.g. possible using soft lithographic techniques.[7] However, the reaction is notoriously difficult to control due to the tendency of silanes to condense in solution.[8, 9] In addition, the high reactivity of organotrichlorosilanes requires careful handling and limits their use in an industrial environment. Thirdly, the monolayer is only stable in a relatively small range of conditions[10] and is prone to hydrolysis.

In Langmuir 22, 8359-8365 (2006), incorporated by reference herein, Mischki et al. compared the photochemical and thermal reaction of alkenes with both H-terminated and OH-terminated silicon surfaces.[11] The photochemical reaction of 1-decene with silicon oxide-covered silicon at a wavelength of 300 nm is disclosed. However, this reaction leads to surfaces with a lower hydrophobicity (contact angle of 59°), a lower coverage, and a lower reaction rate as compared to the thermal reaction of the OH-terminated surface (contact angle of 91°). Reaction of the H-terminated surfaces with 1-decene resulted in surfaces with a comparable hydrophobicity for both the thermal and the photochemical reaction (contact angle of 102° in both cases), but the coverage of the surface and the reaction rate were higher for the thermal reaction.

Several methods for the modification of metal surfaces are known from prior art. For example US 2002/0018854, incorporated by reference herein, discloses a method for the modification of an OH-terminated metal surface using hydridosilanes. The modification reaction can be performed in the vapor phase, in the liquid phase, in supercritical fluids, in dilute or concentrated solutions, and at high or low temperatures. Examples include the surface modification of titanium, stainless steel, nickel and tin.

Recently, Raman et al. disclosed in Langmuir, 23, 2284-2288 (2007), incorporated by reference herein, a method for the surface modification of stainless steel, the method comprising the formation of self-assembled monolayers of long alkyl chain carboxylic acids with different terminal groups on the native oxide layer of stainless steel 316L via a solution-deposition method. The monolayers formed were chemically and mechanically stable. Static contact angles varied from 38° to 42° for the surfaces modified with acids comprising a hydrophilic terminal functional group, whereas the surface modified with octadecylcarboxylic acid showed a static contact angle of 104°.

For alumina, no method is available yet that yields hydrolytically stable monolayers. For these and the other specified metal oxide surfaces no photochemical method to attach high-quality organic monolayers is reported.

SUMMARY OF THE INVENTION

The present invention relates to a process for the modification of a solid material having a surface comprising hydroxyl-groups, said process comprising the step of contacting said material, under radiation with ultraviolet light and/or visible light, with a $C_2$-$C_{50}$ alkene and/or a $C_2$-$C_{50}$ alkyne, the alkene and/or alkyne being optionally substituted and/or being optionally interrupted by one or more heteroatoms.

Additionally, the present invention provides a process for the patterning of a solid material, wherein the hydroxyl-functionalized surface of the solid material is contacted, through a mask, for example a photomask, under radiation with ultraviolet light and/or visible light, with a $C_2$-$C_{50}$ alkene and/or a $C_2$-$C_{50}$ alkyne, the alkene and/or alkyne being optionally substituted and/or being optionally interrupted by one or more heteroatoms.

The modified, for example functionalized, and optionally patterned, solid materials according to the present invention, and articles or substrates comprising these solid materials can be applied as a tool in the fields of microelectronics, biosensing, catalysis, microprocess engineering, industrial separations and chromatography.

DETAILED DESCRIPTION OF THE INVENTION

Definitions

Figure 1:
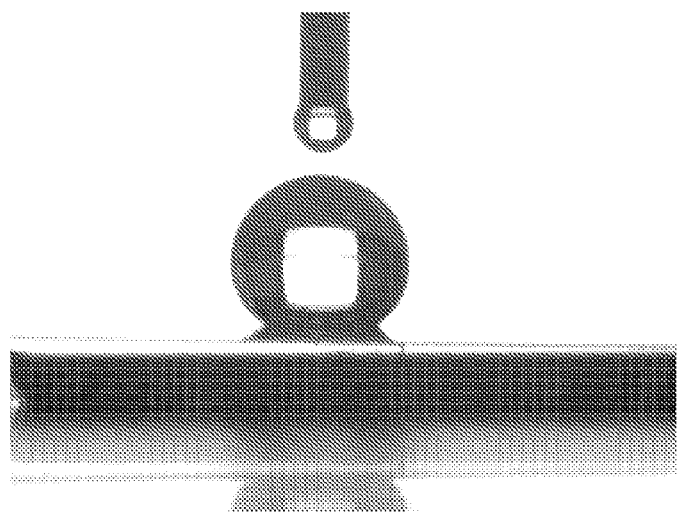
FIG. 1 shows a water drop on a porous alumina sample that is modified with 1-hexadecene. The corresponding static water contact angle is 140°.

The verb "to comprise" as is used in this description and in the claims and its conjugations is used in its non-limiting sense to mean that items following the word are included, but items not specifically mentioned are not excluded. In addition, reference to an element by the indefinite article "a" or "an" does not exclude the possibility that more than one of the element is present, unless the context clearly requires that there is one and only one of the elements. The indefinite article "a" or "an" thus usually means "at least one".

For element 13, Al, two different names and spellings exist, aluminum and aluminium, both of them meaning the same and both them approved by IUPAC. In this description the name "aluminum" is used, as is common practice in the United States. In other countries however, use of the name "aluminium" may be more common.

Unsubstituted alkyl groups have the general formula $C_nH_{2n+1}$ and may be linear or branched. Unsubstituted alkyl groups may also contain a cyclic moiety, and thus have the concomitant general formula $C_nH_{2n-1}$. Optionally, the alkyl groups are substituted by one or more substituents further specified in this document. Examples of suitable alkyl groups include, but are not limited to, methyl, ethyl, 2-propyl, 1-hexyl, 1-dodecyl and the like.

Unsubstituted alkenyl groups have the general formula $C_nH_{2n-1}$, and may be linear or branched. Examples of suitable alkenyl groups include, but are not limited to, ethenyl, propenyl, isopropenyl, butenyl, pentenyl, decenyl, octadecenyl, and eicosenyl and the like. Unsubstituted alkenyl groups may also contain a cyclic moiety, and thus have the concomitant general formula $C_nH_{2n-3}$.

Aryl groups comprise at least six carbon atoms and may include monocyclic, bicyclic and polycyclic structures. Optionally, the aryl groups may be substituted by one or more substituents further specified in this document. Examples of aryl groups include groups such as for example phenyl, naphthyl, anthracyl and the like.

Arylalkyl groups and alkylaryl groups comprise at least seven carbon atoms and may include monocyclic and bicyclic structures. Optionally, the aryl groups may be substituted by one or more substituents further specified in this document. An arylalkyl group is for example benzyl and the like. An alkylaryl group is for example 4-t-butylphenyl and the like.

Where the aryl groups, arylalkyl and alkylaryl are denoted as (hetero)aryl groups, alkyl(hetero)aryl or (hetero)arylalkyl groups, the heteroaryl group comprises one to four heteroatoms selected from the group consisting of oxygen, nitrogen and sulphur. Unsubstituted alkenes have the general formula $C_nH_{2n}$ whereas unsubstituted alkynes have the general formula $C_nH_{2n-2}$.

The phrases 'ultraviolet radiation' and 'radiation with ultraviolet light' are used interchangeably.

Photochemical Modification

The modification of several types of solid materials is known in the art. However, as mentioned above, the processes described in prior art all suffer from disadvantages and/or limitations. Hence it is an aspect of the present invention to provide an alternative method for the modification of solid materials that preferably at least partly obviates one or more of these drawbacks.

It is an aspect of the present invention to provide a process for the modification of a solid material having a surface comprising hydroxyl-groups, said process comprising the step of contacting said material, under radiation with ultraviolet light and/or visible light, with a $C_2$-$C_{50}$ alkene and/or a $C_2$-$C_{50}$ alkyne, the alkene and/or alkyne being optionally substituted and/or being optionally interrupted by one or more heteroatoms.

In one embodiment the contacting of said material is carried out under radiation with light of a wavelength in the range of 200 to 800 nm. In one embodiment the contacting of said material is carried out in the presence of a photoinitiator under radiation with light of a wavelength in the range of 300 to 800 nm. In one embodiment the contacting of said material is carried out under radiation with ultraviolet light.

Thus the invention concerns a process for the modification of a solid material having a surface comprising hydroxyl-groups, said process comprising the step of contacting said material, under radiation
  (a) with light of a wavelength in the range of 200 to less than 300 nm, or
  (b) with light of a wavelength in the range of 300 to 800 nm in the presence of a photoinitiator
with a $C_2$-$C_{50}$ alkene and/or a $C_2$-$C_{50}$ alkyne, the alkene and/or alkyne being optionally substituted and/or being optionally interrupted by one or more heteroatoms.

In an advantageous embodiment of the present invention, the solid material is subjected to a pretreatment step prior to the irradiation step, in order to increase the number of hydroxyl-groups and/or activate the hydroxyl-groups on the surface of the solid material. In a further preferred embodiment, the pretreatment step comprises contacting the solid material with a mixture comprising an acid and optionally an organic solvent. Several methods for the cleaning and/or activation of glass surfaces are described in the literature.[12] The pretreatment step according to the present invention may for example comprise immersing the solid material in a 1:1 (v:v) mixture of hydrochloric acid and methanol for example for 30 minutes or more, followed by washing with water and methanol and drying.

Recently, Mischki et al. reported that illumination of silicon oxide-covered silicon in the presence of 1-decene at 300 nm yielded a surface with a contact angle of 59°.[11] However, the present inventors surprisingly found that upon irradiating a hydroxyl-terminated silicon surface with a lower wavelength, i.e. less than 300 nm, the contact angle of the resulting surface increased to 109°, indicating a significantly increased hydrophobicity of the modified surface. Therefore, according to a preferred embodiment of the invention, the contacting of the solid material is carried out under ultraviolet radiation with a wavelength in the range of 200 to less than 300 nm, preferably in the range of 200 to 295 nm, more preferably in the range of 220 to 285 nm and in particular in the range of 248 nm to 275 nm.

In one embodiment, the process according to the present invention is executed in the presence of a photoinitiator. The present inventors discovered that, in the presence of a suitable photoinitiator, the process according to the present invention gave surprisingly good results at wavelengths above 300 nm. Therefore, in one embodiment the contacting of the solid material is carried out in the presence of a suitable photoinitiator and under radiation with light of a wavelength in the range of 300 to 800 nm, preferably with a wavelength lower than 700 nm, or lower than 600 nm, or lower than 500 nm, or lower than 400 nm, more preferably lower than 380 nm, even more preferably lower than 350 nm and in particular lower than 330 nm. Thus in one embodiment the contacting of said material in the present process is carried out under radiation with light of a wavelength in the range of 200 to 800 nm, preferably in the range of 200 to 500 nm, provided that the contacting is carried out in the presence of a photoinitiator if the radiation is with light of a wavelength of 300 nm or more. Examples of suitable photoinitiators include, but are not limited to alkyl bromides, benzyl iodides, 2,2-dimethoxy-2-phenyl acetophenone, and the like. The amount of photoinitiator present in the reaction mixture may be in the range of 0.01 to 5.0 wt. %, more preferably in the range of 0.01 to 3 wt. %, even more preferably in the range of 0.01 to 2 wt. % and in particular in the range of 0.01 to 1 wt %, relative to the alkene and/or alkyne.

In another preferred embodiment of the invention, the step of contacting the solid material under radiation with light as defined above, with a with $C_2$-$C_{50}$ alkene and/or a $C_2$-$C_{50}$ alkyne is performed at a temperature of about 0° C. to about 50° C. In a further preferred embodiment, this step is performed at ambient temperature, wherein ambient temperature means that no additional external heating or cooling is applied during the process. As will be clear to a person skilled in the art, the application of UV irradiation in itself may lead to a slight warming up of the reactants. However, as long as no additional external heating is applied during the UV irradiation, the process is considered to be executed at ambient temperature.

Solid Materials

The method according to the present invention is applicable to various types of solid materials having a surface comprising hydroxyl-groups, whereby a solid material is defined as a material that is in the solid state at ambient temperature, e.g. 20° C.

Examples of suitable solid materials comprise for example silica, alumina, zeolites, metal oxides, and glass (such as, for example, synthetic fused silica and borosilicate glass), and according to a preferred embodiment of the present invention, the solid material is selected from the group consisting of materials comprising oxides of silicon, oxides of aluminum, and zeolites. In a further preferred embodiment, the solid material comprises $SiO_2$ or $Al_2O_3$.

An important class of zeolites comprises aluminosilicate zeolites, represented by the general chemical formula $M_{2/n}O\cdot Al_2O_3\cdot ySiO_2\cdot wH_2O$, wherein M is the charge balancing cation, usually an alkali or alkaline earth metal such as for example sodium, potassium, magnesium or calcium, n is the cation valence, y is 2 or greater, and w represents the number of moles of water contained in the zeolite voids.[13] Therefore, according to another preferred embodiment of the invention, the solid material is a zeolite of the aluminosilicate variety with formula $M_{2/n}O\cdot Al_2O_3\cdot ySiO_2\cdot wH_2O$, wherein M, n, y and w are defined as mentioned above.

According to another preferred embodiment of the invention, the solid material is a metal or a metal alloy. Since the process according to the present invention modifies a solid material having a surface comprising OH-groups, the surface of the metal or metal alloy may need to undergo an additional oxidizing pretreatment and/or a pretreatment as described above in order to increase the number of hydroxyl-groups and/or activate the hydroxyl-groups on the metal surface. In a further preferred embodiment, the metal is selected from the group comprising aluminum, gallium, indium, tellurium, silicon, germanium, tin, lead, scandium, titanium, vanadium, chromium, manganese, iron, cobalt, nickel, copper and zinc, in particular aluminum, gallium, indium, silicon, tin, iron, cobalt, nickel, copper and zinc. In another preferred embodiment, the solid material is a metal alloy, in particular stainless steel.

The process according to the present invention is also applicable to metal oxides and mixtures thereof. Examples of mixtures of metal oxides comprise for example tin-doped indium oxide (indium tin oxide or ITO) and aluminum-doped zinc oxide.

The process according to the present invention may be applied on various different types of surfaces, both planar and highly curved, and examples comprise micro- and nanoparticles, powders, crystals, films or foils, and, in addition, the process may be applied on the surfaces of materials comprising oxides of these metals, such as for example technical ceramics.

Alkenes/Alkynes

The process according to the present invention may be executed with a variety of, internal or terminal, $C_2$-$C_{50}$ alkenes and/or $C_2$-$C_{50}$ alkynes, the alkene and/or alkyne being optionally substituted and/or being optionally interrupted by one or more heteroatoms, preferably 1 to 10 heteroatoms, said heteroatoms preferably being selected from the group consisting of O, S and $NR^1$, wherein $R^1$ is defined as below. Most preferably, the heteroatom is O.

According to one embodiment of the present invention, the $C_2$-$C_{50}$ alkene and/or the $C_2$-$C_{50}$ alkyne is a terminal $C_2$-$C_{50}$ alkene and/or a terminal $C_2$-$C_{50}$ alkyne. Furthermore, the $C_2$-$C_{50}$ alkene and/or $C_2$-$C_{50}$ alkyne may be linear, or branched. In a preferred embodiment of the invention, the $C_2$-$C_{50}$ alkene and/or the $C_2$-$C_{50}$ alkyne is substituted with one or more, optionally masked or protected, functional groups Q selected from the group consisting of hydrogen, halogen (preferably F or Cl), $R^1$, $-CH=CH(R^1)_2$, $-C\equiv CR^1$, $-[CH_2CH_2O]_n-R^1$ wherein n is in the range of 1 to 200, $-CN$, $-N_3$, NCX, $-XCN$, $-XR^1$, $-N(R^1)_2$, $-^+N(R^1)_3$, $-CN$, $-C(X)N(R^1)_2$, $-C(R^1)_2XR^1$, $C(X)R^1$, $-C(X)XR^1$, $-S(O)R^1$, $-S(O)_2R^1$, $-S(O)OR^1$, $-S(O)_2OR^1$, $-S(O)N(R^1)_2$, $-S(O)_2N(R^1)_2$, $-OS(O)R^1$, $-OS(O)_2R^1$, $-OS(O)OR^1$, $-OS(O)_2OR^1$, $-P(O)(R^1)(OR^1)$, $-P(O)(OR^1)_2$, $-OP(O)(OR^1)_2$, $-Si(R^1)_3$, $-XC(X)R^1$, $-XC(X)R^1$, $-XC(X)N(R^1)_2$, $-N(R^1)C(X)R^1$, $-N(R^1)C(X)XR^1$ and $-N(R^1)C(X)N(R^1)_2$, wherein X is oxygen or sulphur and wherein $R^1$ is independently selected from the group consisting of hydrogen, halogen (preferably F or Cl), $C_1$-$C_{24}$ alkyl groups, $C_6$-$C_{24}$ (hetero)aryl groups, $C_7$-$C_{24}$ alk(hetero)aryl groups, $C_7$-$C_{24}$ (hetero)arylalkyl groups, and, in particular, activated esters such as for example derived from N-hydroxysuccinimide (NHS), or NHS-derivatives, $-C(O)OCH_2CF_3$, $-C(O)O(C_6F_5)$ and the like. The alkyl groups, (hetero)aryl groups, alkyl(hetero)aryl groups, and (hetero)arylalkyl groups are as defined previously. As mentioned above, the $R^1$ groups may be selected independently from each other, which means that the two $R^1$ groups present in, for example, a $-N(R^1)_2$ substituent may be different from each other. A preferred type of functional groups Q comprises the group of ethers, represented by $-C(R^1)_2XR^1$, wherein X is O or S and the $R^1$ group adjacent to the O or S is a $C_1$-$C_{24}$ alkyl group, a $C_6$-$C_{24}$ (hetero)aryl group, a $C_7$-$C_{24}$ alkyl(hetero)aryl groups or a $C_7$-$C_{24}$ (hetero)arylalkyl group. As explained before, all three $R^1$ groups of $-C(R^1)_2XR^1$ may be different from each other. Furthermore, the two C-atoms adjacent to the ether-oxygen or -sulfur in the $-C(R^1)_2XR^1$ group may be joined, to form for example an epoxyethyl substituent, or, alternatively, two of the $R^1$ groups may form a cyclic structure, hence cyclic (thio)ethers such as for example ethyleneoxide or propyleneoxide are included in the definition of functional group Q.

According to yet another preferred embodiment of the present invention, the $C_2$-$C_{50}$ alkene and/or the $C_2$-$C_{50}$ alkyne is substituted, preferably at the co-position, with a group according to the general formula I or II, or tautomers thereof, wherein $R^2$ is selected from the group consisting of an element from the group as defined for $R^1$, biotin, oligosaccharides, oligonucleotides (e.g. DNA, RNA, PNA, LNA and the like), peptides or fragments thereof, and buckyballs.

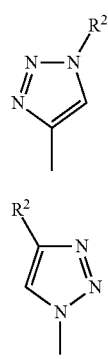

In one embodiment the alkene and/or alkyne is undissolved or undiluted, or in other words neat or pure (i.e. with commercially available purities), when it is contacted under radiation with a solid material. Under certain circumstances, it may be advantageous to perform the process according to the invention with a solution of the $C_2$-$C_{50}$ alkene and/or $C_2$-$C_{50}$ alkyne, as opposed to the neat alkene and/or alkyne. This may be the case when for example the alkene and/or alkyne is very costly, or when the supply is limited. As will be apparent to a person skilled in the art, the solvent used is preferably inert towards the radiation that is applied, in particular is preferably inert towards ultraviolet radiation. Suitable solvents are water and commonly used organic solvents and include, but are not limited to, isopropyl alcohol, methyl cyclohexane, ethanol, methanol, cyclohexane, acetonitrile, 2,2,4-trimethylpentane, iso-octane, hexane, dioxane and glycerol, dichloromethane and 1,2-dichloro ethane.

Modified Solid Materials

It was found that the mild photochemical process according to the present invention gave surprisingly good results with regard to the stability and hydrophobicity of the modified solid materials. In addition, the process according to the invention is very reproducible, especially when compared to known processes, in particular with respect to humidity. As an example, the hydrophobicity of a modified alumina surface is depicted in FIG. 1, which shows a water drop on a porous alumina sample that is modified with 1-hexadecene. The corresponding static water contact angle is 140°.

The present invention also relates to a solid material having a modified surface obtained by the process according to the present invention, and in particular to a solid material comprising spatially confined microchannels, on and/or under the surface of the solid material, that are modified according to the process of the present invention. In one embodiment the modified surface is the surface of spatially confined microchannels, on and/or under the surface of the solid material. In addition, the invention relates to a product, e.g. an article or substrate comprising the modified solid material according to the invention.

The modified silica surfaces according to the present invention show a high thermal and hydrolytic stability. Alumina modified with 1-alkynes shows high hydrolytic stability as well, whereas alumina modified with 1-alkenes is easily hydrolyzed. For alumina, the process according to the present invention is one of the first processes that yields hydrolytically stable monolayers on the alumina surface, and the first process in which an alumina surface is modified photochemically. The photochemical modification of alumina according to the present invention makes the modification of the surface with a large variety of functional groups possible, under mild conditions.

As is described in more detail in the Examples, detailed surface studies showed that the alkenes initially bind to the surface OH-groups in a Markovnikov fashion.

On silica, prolonged illumination times led to oligomerization, resulting in continued layer growth normal to the surface.

Applications

Figure 2:
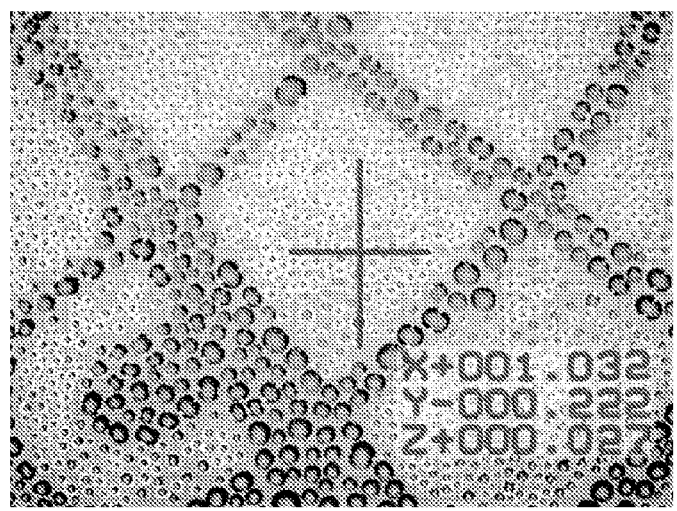
FIG. 2 shows a micrograph of a hydrophobically patterned synthetic fused silica sample exposed to water vapor. The sample was patterned with 1-hexadecene.
Figure 3:
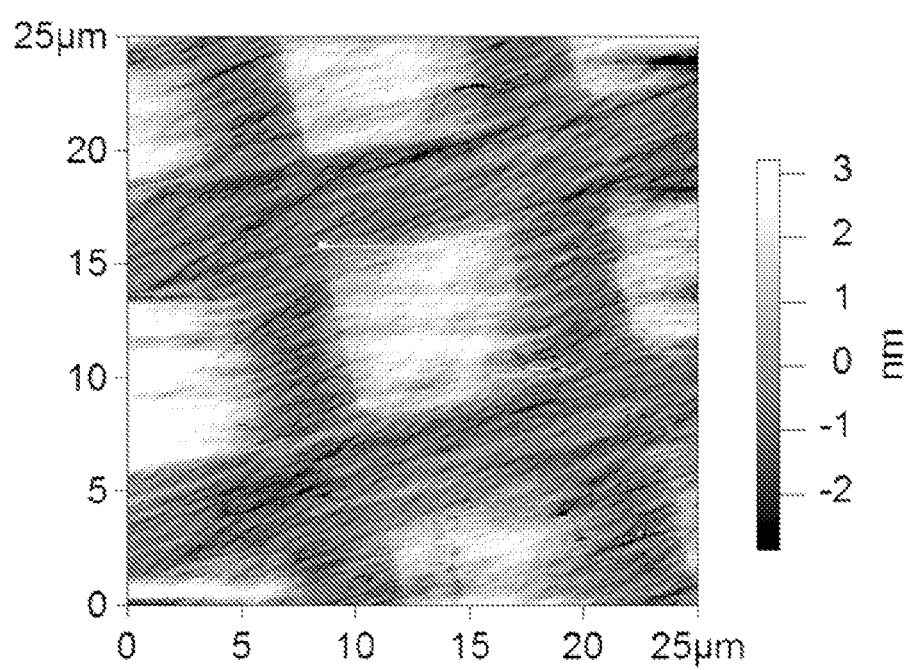
FIG. 3 shows the topography of a synthetic fused silica sample that was patterned with 1-hexadecene, measured with atomic force microscopy in contact mode.

As the process according to the present invention is photochemically initiated, the compatibility with photolithography was examined, in particular photolithography on silica and aluminum oxide surfaces, which was up to now impossible. Using a contact mask, μm-sized patterns were easily transferred to the surface. FIG. 2 shows a micrograph of a hydrophobically patterned synthetic fused silica sample exposed to water vapor. The sample was patterned with 1-hexadecene. The droplets formed on the illuminated, hydrophobic parts of the surface are small and appear colored, while droplets formed on the masked area are bigger and appear dark. The different size and appearance is caused by differences in hydrophilicity, introduced by the photochemical reaction. FIG. 3 shows the topography of a synthetic fused silica sample that was patterned with 1-hexadecene, measured with atomic force microscopy in contact mode. The contact mode measurements clearly revealed 7.5×7.5 μm squares with a spacing of 5 μm, both in topography and in lateral mode. The underlying texture of the polished slides can also be distinguished. The height difference between the patterned and unpatterned area is at least 3 nm (not corrected for differences in elasticity). This value is bigger than the maximum chain length of one molecule of 1-hexadecene (1.9 nm), confirming the growth of an oligomeric multilayer. FIGS. 2 and 3 display the first examples of photolithography onto glass, and reveal the power of this mild method of surface modification.

Thus in one embodiment, the process according to the invention is for modifying the surface of the solid material with a predetermined pattern.

Therefore, according to a preferred embodiment, a predetermined part of the solid material is subjected to radiation with ultraviolet light and/or visible light as specified above, preferably with light of a wavelength in the range of 200 to 800 nm, whereby a selectively modified surface of the solid material is obtained. In a further preferred embodiment, an appropriate mask, such as for example a photomask or a mask that is in direct contact to the solid material, selectively blocks a predetermined part of the solid material from being irradiated, resulting in selective modification of that part of the surface that is not blocked by the mask, i.e. patterning of the surface.

The ability to perform photolithography on the surfaces according to the present invention enables the patterning of said surface. In a further preferred embodiment the method according to the invention is applied for the selective modification, with a predetermined pattern, of the surface of spatially confined microchannels on or below the surface of a solid material. So far, this has not been possible with other methods. Thus in one embodiment the modified surface is the surface of spatially confined microchannels, on and/or under the surface of the solid material.

Another preferred embodiment of the present invention comprises the use of the solid material or product comprising the solid material according to the invention, which is optionally functionalized or optionally patterned, in particular optionally patterned or functionalized silica, alumina, or zeolite, as a tool in microelectronics, microprocess engineering, biosensing, catalysis, chromatography and industrial separation.

EXAMPLES

Materials and Chemicals

Glassware used for surface modification was cleaned with organic solvents and etched overnight in basic detergent solution. Prior to use, it was rinsed with ultrapure water and dried at 120° C. 1-Hexadecene (98%, Sigma-Aldrich) was purified by column chromatography and vacuum distillation. 1-Hexadecyne was obtained by reacting 1-bromotetradecane with lithium acetylide ethylenediamine complex in dimethylsulfoxide. 11-Fluoroundec-1-ene was synthesized as described elsewhere.[14] 2,2,2-Trifluoroethyl undec-10-ynoate and 2,2,2-trifluoroethyl undec-10-enoate were synthesized by esterification of 10-undecynoic acid, respectively 10-undecenoic acid, with 2,2,2-trifluoroethanol using N,N'-dicyclohexylcarbodiimide as a coupling reagent and 4-dimethylaminopyridine as a catalyst. Solvents used were either of analytical grade or distilled prior to use.

Example 1

Surface Modification

A specially designed quartz flask was filled with 1-hexadecene (~2 ml). This was degassed using three consecutive freeze-pump-thaw cycles. Liquid $N_2$ was used as cooling agent. Prior to sample immersion, the 1-hexadecene was frozen again by short immersion in liquid $N_2$ and the flask was filled with argon.

A synthetic fused silica slide (15×25 mm, Praezisions Glas & Optik, Iserlohn, Germany) was cleaned by sonication in acetone for 5 min. After drying with argon, the slide was immersed in a freshly made 1:1 (v:v) mixture of hydrochloric acid (37%, analytical grade, Acros) and methanol for at least 30 min. The slide was rinsed with ultrapure water, dried with argon and added to the flask containing frozen 1-alkene. Vacuum was applied again until the 1-alkene was molten completely and the slide was immersed, after which the flask was filled with argon and kept under a slight overpressure. Two low pressure mercury lamps (6.0 mW/cm$^2$, Jelight, Irvine Calif., USA) were placed at a fixed distance (~0.5 cm) from the fused silica slide. For some experiments, a longpass filter (cut-on wavelength 275 nm, Asahi Spectra, Torrance Calif., USA) was placed in between the lamps and the flask. The setup was packed in aluminum foil and the slide was illuminated for a specified time. After illumination, the slide was removed from the flask, rinsed with petroleum ether 40/60 and ethanol, sonicated in ethanol and dichloromethane for 5 min per solvent, rinsed with dichloromethane and finally dried with argon.

The various solid materials that were modified according to the process are shown in Table 1.

TABLE 1

Modified surfaces

| Example | Solid material | Alkene/alkyne | Modification time (h) |
|---|---|---|---|
| 1A | Synthetic fused silica | 1-hexadecene | Various |
| 1B | Synthetic fused silica | 11-fluoro-undecene | 8 h |
| 1C | Synthetic fused silica | 2,2,2-trifluoroethyl undec-10-enoate | 8 h |
| 1D | Alumina | 1-hexadecene | Various |
| 1E | Alumina | 1-hexadecyne | Various |
| 1F | Alumina | 2,2,2-trifluoroethyl undec-10-ynoate | 8 h |
| 1G | Alumina | 1,15-hexadecadiyne | 16 h |
| 1H | Copper(II) oxide | 1-hexadecene | 7 h |
| 1I | Stainless steel | 1-hexadecene | 8 h |
| 1J | Stainless steel | 2,2,2-trifluoroethyl undec-10-enoate | 16 h |
| 1K | Indium tin oxide on glass support | 1-hexadecene | 16 h |
| 1L | Indium tin oxide on glass support | 2,2,2-trifluoroethyl undec-10-enoate | 16 h |
| 1M | Titanium oxide | 1-hexadecene | 16 h |

Example 2

Water Contact Angle Measurements

Static contact angles were measured using a Krüss DSA-100 goniometer. Droplets of 3 µl were dispensed on the surface and contact angles were measured with a CCD camera using a tangential method. The reported value is the average of at least 5 droplets and has an error of ±1°.

The influence of the modification time on the degree of modification of the synthetic fused silica slides of Example 1A was assessed by determining the surface wettability with static contact angle measurements. The measured static water contact angle after various modification times is shown in Table 2. It was found that the contact angle increased steadily with modification time, reaching a maximum value of 109±1° with a modification time of 8 hours.

Modification of porous alumina substrates with 1-hexadecene (Example 1D) yielded highly hydrophobic surfaces as well. The measured static water contact angle after various modification times is shown in Table 2. The contact angle increased with modification time, reaching a maximum value of 141±1° with a modification time of 8 hours.

Table 2 also contains the contact angles of several other solid materials that have been modified with 1-hexadecene.

The measured static water contact angle after various modification times for porous alumina modified with 1-hexadecyne (Example 1E) is shown in Table 3.

Table 4 displays the static water contact angles of solid materials that have been modified with 2,2,2-trifluoroethyl undec-10-enoate.

TABLE 2

Static water contact angle of solid materials modified with 1-hexadecene after various modification times.

| Synthetic fused silica (Example 1A) | | Porous alumina (Example 1D) | | Copper oxide (Example 1H) | |
|---|---|---|---|---|---|
| Modification time (h) | Contact angle (°) | Modification time (h) | Contact angle (°) | Modification time (h) | Contact angle (°) |
| 1 | 80 | 2 | 135 | 7 | 116 |
| 2 | 98 | 4 | 138 | | |
| 3 | 99 | 8 | 141 | | |
| 5 | 105 | | | | |
| 8 | 109 | | | | |
| 16 | 110 | | | | |

TABLE 2-continued

Static water contact angle of solid materials modified with
1-hexadecene after various modification times.

| Stainless steel (Example 1I) | | Indium tin oxide (Example 1K) | | Titanium oxide (Example 1M) | |
|---|---|---|---|---|---|
| Modification time (h) | Contact angle (°) | Modification time (h) | Contact angle (°) | Modification time (h) | Contact angle (°) |
| 16 | 118 | 16 | 112 | 16 | 115 |

TABLE 3

Static water contact angle of solid materials modified with
1-hexadecyne after various modification times.
Porous alumina
(Example 1E)

| Modification time (h) | Contact angle (°) |
|---|---|
| 2 | 136 |
| 4 | 137 |
| 8 | 137 |

TABLE 4

Static water contact angle of solid materials modified with
2,2,2-trifluoroethyl undec-10-enoate.

| Example | Solid material | Contact angle (°) |
|---|---|---|
| 1C | Synthetic fused silica | 85 |
| 1L | Indium tin oxide | 89 |

The hydrophobicity of a modified alumina surface (Example 1D) is depicted in FIG. 1, which shows a water drop on a porous alumina sample that is modified with 1-hexadecene. The corresponding static water contact angle is 140°.

Furthermore, the surface wettability of the modified surfaces of Example 1A-1M did not change upon sonication of the samples in organic solvents, indicating that the (hydrophobic) layer on the surface was stable and tightly bound.

Example 3

Infrared Spectroscopy

Infrared spectra were obtained with a Bruker Tensor 27 FT-IR spectrometer, either in transmission mode or in infrared reflection absorption (IRRA) mode. For the latter, a commercial variable-angle reflection unit (Auto Seagull, Harrick Scientific) was used, in combination with a Harrick grid polarizer that was installed in front of the detector and was used for measuring spectra with s-polarized radiation with respect to the plane of incidence at the sample surface. Single channel IRRA transmittance spectra were collected at an angle of 75° using a spectral resolution of 4 cm$^{-1}$ and 2048 scans in each measurement. Transmission spectra were collected using a spectral resolution of 2 cm$^{-1}$ and 256 scans in each measurement. The raw data were divided by the data recorded on a freshly cleaned reference sample, after which a baseline correction was applied to give the reported spectra.

The samples of Example 1A were studied with infrared reflection-absorption spectroscopy in order to confirm the presence of a hydrophobic layer. The obtained IRRA spectra displayed that the intensity of the C—H stretching vibrations increased with modification time, also with a modification time longer than 8 hours, when no further change in the contact angle was observed. This implies that the absorbed layer is still growing, even after 8 hours of irradiation. This increased peak intensity at prolonged modification times is likely to be caused by on-going growth normal to the surface.

Compared to unmodified reference samples, the modified samples of Example 1A showed decreased absorptions in the OH region, indicating a decrease in the number of hydroxyl-groups on the surface as compared to the unmodified samples (although loss of physisorbed water may partly contribute to the decreased absorption in this region).

The IRRA spectra of the samples modified with 11-fluoro-undecene of Example 1B showed the presence of a methyl-stretching signal, indicating the presence of a methyl-group. Since no methyl-group is present in 11-fluoro-undecene, this indicates that the surface modification proceeds via Markovnikov addition of the alkene to the surface.

The samples of example 1D, 1E, 1F and 1G were studied in transmission mode. For the samples of example 1D, an increase in the intensity of C—H stretching vibrations with modification time was observed up to a modification time of 8 h. After that, no further increase was observed. This is consistent with the process of monolayer formation. Compared to an alumina sample modified with 1-hexadecene for 8 h, a sample modified with 1-hexadecyne (Example 1E) for 8 h shows approximately equal C—H stretching vibration intensity.

Compared to unmodified reference samples, the modified samples of Example 1D and 1E show decreased absorptions in the OH region, indicating a decrease in the number of hydroxyl groups on the surface as compared to the unmodified samples.

The IR spectra of the samples of example 1F show increased absorption in the C—H stretching region as well as decreased absorption in the OH region. In addition, the $CH_3$ stretching vibration could not be observed and a carbonyl stretching vibration at 1740 cm$^{-1}$ was introduced, confirming the adsorption of the ester.

The IR spectra of the samples of example 1G also did not show $CH_3$ stretching vibrations, but instead showed absorptions at 3320 and 2120 cm$^{-1}$, confirming the presence of terminal alkyne groups on the surface.

Example 4

X-Ray Photoelectron Spectroscopy (XPS)

XPS analyses were performed using a JPS-9200 photo-electron spectrometer (JEOL). The spectra were obtained under ultrahigh vacuum (UHV) conditions using monochromatic Al K X-ray radiation at 12 kV and 25 mA, with an analyzer pass energy of 30 eV. The X-ray incidence angle and the electron acceptance angle were 80° and 10° with respect to the surface normal, respectively. To prevent surface charging during measurements, samples were irradiated with electrons with a kinetic energy of 3.8 eV. Peaks were shifted using the $C_{1s}$ peak at 285.0 eV as a reference. Spectra were corrected using a linear background subtraction before quantification and any peak deconvolution.

XPS analysis of the modified samples of Example 1A showed the presence of three elements only: Si, O and C. The $C_{1s}$ atomic ratio increased with modification time, whereas the $Si_{2p}$ and $O_{1s}$ signals decreased, as a result of the growth of the adsorbed hydrocarbon layer. The increase in C atomic ratio is gradual for small modification times, but after about 5 hours the relative C signal rises rapidly, giving rise to a sigmoidal curve.

At long modification times (>10 hours), the absolute $O_{1s}$ and $Si_{2p}$ signals are less than 20% of those of unmodified samples, measured as a reference in the same conditions.

The oxygen deficiency of the surface of Example 1A was determined by calculating the XPS $O_{1s}/Si_{2p}$ ratio. For cleaned, unmodified silica this ratio was found to be 1.7, thereby implicitly confirming the presence of oxygen-deficient centers. To investigate whether these defects play a role in the photochemical reaction on the surface, the XPS $C_{1s}$ spectrum of a modified sample of Example 1A was further examined. Deconvolution of the high resolution $C_{1s}$ spectrum for a sample that was modified for 5 hours shows two contributions. The major contribution is from C atoms solely bound to C or H atoms, which was set to 285 eV. The other contribution is found at 286.8 eV. A similar shift was observed for long-chain alcohols absorbed on glass and was attributed to the carbon atoms bound to oxygen in a C—O bond.[15] The ratio of the peak area at 286.8 eV to the total carbon peak area is 1 to 15.2, which would correspond to one C—O bond per molecule of 1-hexadecene. Thus, we can conclude that 1-hexadecene binds to the surface hydroxyl groups. Oxygen-deficient surface defects therefore do not necessarily play a stoichiometric role in the reaction. Deconvolution of XPS spectra of samples of Example 1A that were modified for more than 5 hours show a reduced contribution of oxygen-bound C atoms to a level where they becomes indiscernible, indicating that at prolonged reaction times another mechanism comes into play. This is in agreement with the XPS results described above, which showed a sharp increase of the $C_{1s}$ signal after 5 hours of modification.

XPS analysis of the modified samples of Example 1D and 1E showed the presence of Al, O, C and small amounts of Si. Si was also found to be present in the unmodified samples and is an impurity in the solid material. The strong attenuation of the $O_{1s}$ electron intensity at prolonged modification times was not observed in the case of alumina, indicating that the adsorbed hydrocarbon layer is only several nanometers thick and likely is a monolayer.

XPS analysis of the modified sample of Example 1I showed the presence of Fe, Cr, O and C as main elements on the modified surface. Compared to an unmodified stainless steel sample, the C signal increased, while the O, Fe and Cr signals were attenuated. This proves the formation of an adsorbed hydrocarbon layer.

The surface composition of modified stainless steel and of other modified solid materials is displayed in Table 5. All these modified materials show a significant amount of carbon at their surfaces, confirming the formation of an adsorbed hydrocarbon layer.

TABLE 5

Surface composition of solid materials modified with 1-hexadecene as determined with XPS, where M is the total contribution of metallic elements in the solid material.

| Example | Solid material | M (%) | O (%) | C (%) |
|---|---|---|---|---|
| 1I | Stainless steel | 8.0 | 32.6 | 59.5 |
| 1K | Indium tin oxide | 20.2 | 26.7 | 52.8 |

The high-resolution $C_{1s}$ spectra of Examples 1C, 1F, 1J, and 1L showed signals at 293.5 and 289.7 eV, which can be attributed to the $CF_3$ and C=O groups. In addition, $F_{1s}$ electrons could be detected. These results confirm the attachment of 2,2,2-trifluoroethyl undec-10-enoate and 2,2,2-trifluoroethyl undec-10-ynoate to the surface.

Example 5

Determination of Attenuation Lengths

Electron attenuation lengths (EALs) were determined using the NIST Electron Effective-Attenuation-Length database.[16] In this program, electron inelastic mean free paths (IMFPs) were determined using the TPP-2M equation.[17] This required input of the density as well as the bandgap of the 1-hexadecene adlayer. For both parameters, the values of (low-density) polyethylene, 0.92 g/cm$^3$ and 8.8 eV respectively, were used as an approximation. The uncertainty in the attenuation length is mainly dependent on the uncertainties in the calculated IMFP, the transport mean free path and the transport approximation,[16] and likely amounts to 20-30%. The calculated layer thickness can therefore only be used as an indication of the true layer thickness.

The thickness of the growing hydrocarbon layer can be calculated using:

$$I_{Si} = I_{Si}^{\infty} \exp\left(\frac{-d}{\lambda_{Si,C} \cos\theta}\right)$$

with $I_{Si}$=absolute silicon peak intensity, $I_{Si}^{\infty}$=absolute silicon peak intensity of unmodified, cleaned fused silica, d=thickness of the adsorbed layer, $\lambda_{Si,C}$=attenuation length of $Si_{2p}$ electrons in the hydrocarbon layer, and θ=electron take-off angle. $\lambda_{Si,C}$ was calculated to be 4.9 nm using the NIST Electron Effective-Attenuation-Length database.[16] Similarly, the adlayer thickness can be calculated from the oxygen peak intensities using the attenuation length of $O_{1s}$ electrons in the hydrocarbon layer (3.6 nm). Using this method, the thickness of the hydrocarbon layer was, after 5 hours of modification, calculated to be 1.7 nm. This is slightly less than the length of a 1-hexadecene molecule (1.9 nm, as determined with Chem3D), indicating that the layer formed is still a (sub-)monolayer. After 16 hours of modification, the estimated layer thickness was calculated to be 10 nm. This evidence shows that after long modification times the attached coating layer is significantly thicker than a monolayer.

Example 6

ThermoGravimetric-Mass Spectrometry

TG-MS analyses were carried out in a TGA/SDTA851e instrument (Mettler-Toledo GmbH, Switzerland), coupled to a Thermostar GSD 301T2 quadrupole mass spectrometer (Pfeiffer Vacuum GMBH, Asslar). Samples were weighed into 100 μL aluminum crucibles and sealed. The seals were pin-holed and the crucibles were heated in the TGA from 25 to 400° C. at 10° C. min$^{-1}$. Dry $N_2$ gas was used for purging. The detection limit of the MS for release gases was 10$^{-14}$ mbar. A Multiple Ion Detection (MID) measurement was performed with a channeltron voltage of 950 V. The scan measurements were performed over a mass range 0-130 amu.

The thermal stability of the modified samples of Example 1 was studied using thermogravimetry-mass spectroscopy (TG-MS). No hydrocarbon fragments could be detected by MS when modified samples were heated up to 400° C. in a nitrogen atmosphere. This contrasts to unmodified reference samples, which showed desorption of physically adsorbed hydrocarbon fragments between 70 and 160° C. The absence of physisorbed material on the modified surface may be explained by its lower surface energy compared to cleaned fused silica.[18] In addition to the TG-MS measurements, samples were heated to 200° C. in an argon-purged vacuum oven and cooled down again. Because of the slow heating and cooling rate of the oven, the samples were exposed to a temperature of at least 185° C. for more than 1 hour. XPS spectra were taken prior to and after this thermal treatment. No significant changes (>2% in relative $C_{1s}$ intensities) were observed. This is in agreement with the TG-MS results, supporting the conclusion that the modified surfaces are thermally stable.

Example 7

Hydrolytic Stability

The hydrolytic stability of the samples of examples 1A, 1D and 1E was tested by immersing the samples in ultrapure water for a specified time. After intervals of initially 15 and later on 60 minutes, a sample was removed from the water bath, rinsed with ethanol and dichloromethane and dried with argon. Its hydrophobicity was assessed by measuring the static water contact angle, using the procedure described in Example 2, after which the sample was reimmersed in the water bath.

The fused silica slides of example 1A showed a slight decrease in hydrophobicity after immersion. However, after 90 minutes, the static water contact angle was still 104°, showing that the samples are stable against hydrolysis.

The porous alumina samples of example 1D show a dramatic decrease in hydrophobicity after immersion. After 90 minutes, the static water contact angle decreased to below 20°, indicating complete desorption of the hydrocarbon layer.

The porous alumina samples of example 1E show a slight decrease in hydrophobicity after immersion. However, after 90 minutes, the static water contact angle was still 120°, showing that the samples are stable against hydrolysis. After 24 h of immersion, the sample was still hydrophobic, displaying a static water contact angle of 108°.

Example 8

Photolithography

Photolithography was performed with cleaned slides and degassed 1-hexadecene in a glove box. An electron microscope grid (T2000-Cu or SEM F1 (Au), Gilder Grids) was contacted with the fused silica slide, on top of which the 1-alkene was dropped. A fused quartz microscope slide (Alfa Aesar) was used as a cover, onto which a mercury capillary lamp (Jelight) was pointed. Samples were irradiated for 10 h, then removed from the glove box and cleaned as described in Example 1. After cleaning, the samples were exposed to water vapor, leading to visualization of the pattern by condensation of water on the surface, as is shown in FIG. 2. The droplets formed on the illuminated, hydrophobic parts of the surface are small and appear colored, while droplets formed on the masked area are bigger and appear dark. The different appearance is caused by differences in hydrophilicity, introduced by the photochemical reaction.

Example 9

Atomic Force Microscopy

AFM images (512×512 pixels) were obtained with an MFP3D AFM (Asylum Research, Santa Barbara, Calif.). The imaging was performed in contact mode in air using NP silicon nitride cantilevers with a stiffness of 0.58 N/m (Veeco Metrology, Santa Barbara, Calif.) at a scan speed of 18.75 μm/s. The scan angle was 90° with respect to the cantilever axis, which allowed the simultaneous recording of lateral force images. Images were flattened with a $0^{th}$ order flattening procedure using the MFP3D software.

AFM was used to study the modified samples of Example 7. As is shown in FIG. 3, contact mode measurements clearly revealed 7.5×7.5 μm squares with a spacing of 5 μm, both in topography and in lateral mode. The underlying texture of the polished slides can also be distinguished. The height difference between the patterned and unpatterned area is at least 3 nm (not corrected for differences in elasticity). This value is bigger than the maximum chain length of 1-hexadecene (1.9 nm), again confirming the growth of an oligomeric multilayer. FIGS. 2 and 3 display the first examples of photolithography onto glass, and reveal the power of this mild method of surface modification.

Example 10

Modification of Silica Particles for Chromatography

A specially designed quartz tube was filled with 1-hexadecene (~10 ml) and equipped with a stirring bar. This was degassed using three consecutive freeze-pump-thaw cycles. Liquid $N_2$ was used as cooling agent. Prior to sample immersion, the 1-hexadecene was frozen again by short immersion in liquid $N_2$ and the tube was filled with argon.

Silica particles (2 gram, 10 μm diameter, Spherisorb) were activated by storing them overnight at 120° C. in a vacuum oven. The silica was taken from the oven and directly added to the frozen 1-hexadecene. Vacuum was applied again until the 1-alkene was molten completely and the particles were immersed, after which the tube was filled with argon and kept under a slight overpressure. The particles were kept in suspension by stirring. Two low pressure mercury lamps (6.0 mW/cm$^2$, Jelight, Irvine Calif., USA) were placed close to the tube. The setup was packed in aluminum foil and the suspension was illuminated for 24 hours.

After illumination, the suspension was transferred to a centrifuge tube. The particles were precipitated by centrifugation (1000 rpm, 1 minute) and the supernatant 1-hexadecene was decanted. The particles were washed with dichloromethane (3×20 ml), ethanol (3×20 ml) and semiconductor grade acetone (1×20 ml). Precipitation in between successive washing steps was enhanced by centrifugation. Finally, the silica was dried for 2 hours at 80° C. and stored overnight in a vacuum oven at 40° C.

The hydrophobicity of the silica particles was tested by adding ~10 mg to a test tube containing hexane (5 ml) and water (5 ml) and stirring vigorously. The particles were suspended in the hexane phase, but not in the water phase. Unmodified particles showed the opposite behavior, i.e. they were suspended in the water phase.

In order to compare the behavior of the modified silica particles with commercially available reversed phase silica, modified silica particles (500 mg) were packed to form a solid phase extraction (SPE) column (~1 cm high), after which a top frit was added. The column was washed with a 70% isopropanol/water mixture (10 ml) and water (10 ml). The column was charged by adding an aqueous solution (5 ml) containing Allura Red AC and Brilliant Blue FCF. Initially, a purple band formed at the top of the column, but upon eluting with more water (3 ml), the Allura Red AC eluted. Brilliant Blue FCF could be eluted with a 10% isopropanol/water mixture. The compounds were separated completely (baseline separation). The results were comparable with those obtained with a commercially available SPE column (IST Isolute C18, 500 mg). However, when the same protocol was applied to unmodified silica, complete separation of the compounds could not be obtained. This experiment shows that silica modified photochemically according to the method of the present invention can be used for chromatographic applications.

BIBLIOGRAPHY

1. Brückner, R. Properties and structure of vitreous silica. I. *J Non-Cryst Solids* 5, 123-175 (1970).
2. Altschuh, D., Oncul, S., and Demchenko, A. P. Fluorescence sensing of intermolecular interactions and development of direct molecular biosensors. *J Mol Recognit* 19, 459-477 (2006).
3. Iler, R. K., U.S. Pat. No. 2,657,149 (Oct. 27, 1953).
4. Pesek, J. J. and Matyska, M. T. Methods for the modification and characterization of oxide surfaces. *Interface Sci* 5, 103-117 (1997).
5. Sagiv, J. Organized monolayers by adsorption 0.1. Formation and structure of oleophobic mixed monolayers on solid-surfaces. *J Am Chem Soc* 102, 92-98 (1980).
6. Vansant, E. F., Van Der Voort, P., Vrancken, K. C, *Characterization and chemical modification of the silica surface*, 1st ed. (Elsevier, Amsterdam, 1995).
7. Onclin, S., Ravoo, B. J., and Reinhoudt, D. N. Engineering silicon oxide surfaces using self-assembled monolayers. *Angew Chem Int Edit* 44, 6282-6304 (2005).
8. Silberzan, P., Leger, L., Ausserre, D., and Benattar, J. J. Silanation of silica surfaces—a new method of constructing pure or mixed monolayers. *Langmuir* 7, 1647-1651 (1991).
9. Vallant, T. et al. Formation of self-assembled octadecylsiloxane monolayers on mica and silicon surfaces studied by atomic force microscopy and infrared spectroscopy. *J Phys Chem B* 102, 7190-7197 (1998).
10. Rosso, M. et al. Covalent attachment of organic monolayers to silicon carbide surfaces. *Langmuir* 24, 4007-4012 (2008).
11. Mischki, T. K. et al. Reaction of alkenes with hydrogen-terminated and photooxidized silicon surfaces. A comparison of thermal and photochemical processes. *Langmuir* 22, 8359-8365 (2006).
12. Cras, J. J., Rowe-Taitt, C. A., Nivens, D. A., and Ligler, F. S., *Biosensors & Bioelectronics* 14, 683-688 (1999).
13. Kirk-Othmer, *Encyclopedia of Chemical Technology*, 4$^{th}$ Ed., 1995, Volume 16, 889.
14. Sun, Q. Y. et al. Covalently attached monolayers on crystalline hydrogen-terminated silicon: Extremely mild attachment by visible light. *J Am Chem Soc* 127, 2514-2523 (2005).
15. Fagerholm, H. M., Rosenholm, J. B., Horr, T. J., and Smart, R. S. Modification of industrial E-glass fibres by long-chain alcohol adsorption. *Colloid Surface A* 110, 11-22 (1996).
16. Powell, C. J. and Jablonski, A., *NIST Electron Effective-Attenuation-Length Database-Version* 1.1. (National Institute of Standards and Technology, Gaithersburg, Md., 2003).
17. Tanuma, S., Powell, C. J., and Penn, D. R. Calculations of electron inelastic mean free paths 0.5. Data for 14 organic compounds over the 50-2000 eV range. *Surf Interface Anal* 21, 165-176 (1994).
18. Cong, P. et al. Effect of self-assembled monolayers modified slider on head-disk tribology under volatile organic contamination. *Tribol Lett* 27, 137-143 (2007).

The invention claimed is:

1. A process for the modification of a solid material having a surface comprising hydroxyl-groups, said process comprising the step of contacting said solid material, under radiation with
   (a) light of a wavelength in the range of 200 to less than 275 nm, or
   (b) light of a wavelength in the range of 300 to 800 nm in the presence of a photoinitiator,
   with a $C_2$-$C_{50}$ alkene, a $C_2$-$C_{50}$ alkyne, or both a $C_2$-$C_{50}$ alkene and a $C_2$-$C_{50}$ alkyne, the alkene and/or alkyne being linear or branched.

2. The process according to claim 1, wherein the $C_2$-$C_{50}$ alkene is substituted.

3. The process according to claim 1, wherein the $C_2$-$C_{50}$ alkene further comprises one or more heteroatoms.

4. The process according to claim 1, wherein the $C_2$-$C_{50}$ alkyne is substituted.

5. The process according to claim 1, wherein the $C_2$-$C_{50}$ alkyne further comprises one or more heteroatoms.

6. The process according to claim 1, comprising the step of pretreating said solid material by contacting said solid material with a mixture comprising an acid and optionally an organic solvent.

7. The process according to claim 1, wherein the contacting of said solid material is carried out under ultraviolet radiation with a wavelength in the range of 220 to 275 nm.

8. The process according to claim 7, wherein the contacting of said solid material is carried out under ultraviolet radiation with a wavelength in the range of 248 nm to 275 nm.

9. The process according to claim 1, wherein the contacting of the solid material is carried out in the presence of a photoinitiator and under radiation with light of a wavelength in the range of about 300 to about 800 nm.

10. The process according to claim 9, wherein the wavelength is in the range of 300 to about 500 nm.

11. The process according to claim 10, wherein the wavelength is in the range of about 300 to 380 nm.

12. The process according to claim 11, wherein the wavelength is in the range of about 300 nm to 330 nm.

13. The process according to claim 1, wherein said solid material comprises $SiO_2$, glass, $Al_2O_3$, or combinations thereof.

14. The process according to claim 1, wherein said solid material is a zeolite having the general formula $M_{2/n}O \cdot Al_2O_3 \cdot ySiO_2 \cdot wH_2O$, wherein M is the charge balancing cation, n is the cation valence, y is about 2 or greater, and w represents the number of moles of water contained in the zeolite voids.

15. The process according to claim 1, wherein said solid material is a metal or an oxide thereof.

16. The process according to claim 1, wherein said solid material is a metal alloy or an oxide thereof.

17. The process according to claim 15, wherein the metal is selected from the group consisting of aluminum, gallium, indium, tellurium, silicon, germanium, tin, lead, scandium, titanium, vanadium, chromium, manganese, iron, cobalt, nickel, copper, zinc, and stainless steel.

18. The process according to claim 16, wherein the metal is selected from the group consisting of aluminum, gallium, indium, tellurium, silicon, germanium, tin, lead, scandium, titanium, vanadium, chromium, manganese, iron, cobalt, nickel, copper, zinc, and stainless steel.

19. The process according to claim 1, wherein the step of contacting said solid material is performed at a temperature of about 0° C. to about 50° C.

20. The process according to claim 1, wherein the $C_2$-$C_{50}$ alkene is a terminal $C_2$-$C_{50}$ alkene.

21. The process according to claim 1, wherein the $C_2$-$C_{50}$ alkyne is a terminal $C_2$-$C_{50}$ alkyne.

22. The process according to claim 2, wherein the $C_2$-$C_{50}$ alkene is substituted with a masked or protected functional group.

23. The process according to claim 3, wherein the $C_2$-$C_{50}$ alkene is substituted with a masked or protected functional group.

24. The process according to claim 20, wherein the $C_2$-$C_{50}$ alkene is substituted with a masked or protected functional group.

25. The process according to claim 4, wherein the $C_2$-$C_{50}$ alkyne is substituted with a masked or protected functional group.

26. The process according to claim 5, wherein the $C_2$-$C_{50}$ alkyne is substituted with a masked or protected functional group.

27. The process according to claim 21, wherein the $C_2$-$C_{50}$ alkyne is substituted with a masked or protected functional group.

28. The process according to claim 1, wherein the process comprises modifying the surface of said solid material with a predetermined pattern.

29. The process according to claim 28, wherein said solid material comprises spatially confined microchannels, wherein the surface of said spatially confined microchannels is modified with a predetermined pattern.

30. The process according to claim 1, wherein the contact angle of the surface of the solid material after modification is in a range between 80° and 140°.

* * * * *